United States Patent
Barns et al.

(10) Patent No.: US 7,109,557 B2
(45) Date of Patent: Sep. 19, 2006

(54) SACRIFICIAL DIELECTRIC PLANARIZATION LAYER

(75) Inventors: Chris E. Barns, Portland, OR (US); Kevin P. O'Brien, Portland, OR (US); Anne E. Miller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 10/963,839

(22) Filed: Oct. 12, 2004

(65) Prior Publication Data

US 2005/0070061 A1 Mar. 31, 2005

Related U.S. Application Data

(62) Division of application No. 10/674,579, filed on Sep. 29, 2003, now Pat. No. 6,908,863.

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. ............... 257/396; 257/649; 257/E21; 257/244; 257/257; 257/304

(58) Field of Classification Search ............... 257/396, 257/347, 622, 649, 762, 750
See application file for complete search history.

(56) References Cited

U.S. PATENT DOCUMENTS

| | | | |
|---|---|---|---|
| 6,274,485 B1 * | 8/2001 | Chen et al. | 438/652 |
| 6,287,961 B1 | 9/2001 | Liu et al. | |
| 6,297,554 B1 | 10/2001 | Lin | |
| 6,326,300 B1 | 12/2001 | Liu et al. | |
| 6,342,452 B1 * | 1/2002 | Coronel et al. | 438/710 |
| 6,472,306 B1 | 10/2002 | Lee et al. | |
| 6,576,551 B1 | 6/2003 | Chang et al. | |
| 6,815,332 B1 * | 11/2004 | San et al. | 438/623 |

* cited by examiner

*Primary Examiner*—David Nhu
(74) *Attorney, Agent, or Firm*—Kathy J. Ortiz (57) ABSTRACT

A method of forming a microelectronic structure and its associated structures is described. In one embodiment, a substrate is provided with a sacrificial layer disposed on a hard mask layer, and a metal layer disposed in a trench of the substrate and on the sacrificial layer. The metal layer is then removed at a first removal rate wherein a dishing is induced on a top surface of the metal layer until the sacrificial layer is exposed, and simultaneously removing the metal layer and the sacrificial layer at a second removal rate without substantially removing the hard mask.

4 Claims, 10 Drawing Sheets

SACRIFICIAL DIELECTRIC PLANARIZATION LAYER

This U.S. Patent application is a divisional of U.S. patent application Ser. No. 10/674,579 filed Sep. 29, 2003 now U.S. Pat. No. 6,908,863.

FIELD OF THE INVENTION

The present invention relates to the field of microelectronic processing, and more particularly to methods of forming a sacrificial dielectric planarization layer and structures formed thereby.

BACKGROUND OF THE INVENTION

Microelectronic devices usually include a large number of features or components—such as transistors, switches and conductive lines—built on an underlying substrate or wafer. The components are usually built by successively depositing layers of different materials on the substrate and then etching and/or selectively removing all or part of the deposited layers. The deposited layers are of different materials depending on the component, but can include metals, metal alloys, pure semiconductors, doped semiconductors, and dielectrics. Certain microelectronic devices include a variety of conducting paths or interconnects between components of the device. These interconnects are often built by etching a feature such as a trench, (i.e., a recess) into a dielectric layer, and then depositing a barrier layer and a conductive layer within the trench. To complete the interconnect, the conductive layer must be removed from the regions of the dielectric layer surrounding the feature (also known as the "field"), leaving the trench filled with the barrier layer and the conductive layer, usually metal, separated from the dielectric layer by the barrier layer.

The method of choice for removing the conductive and barrier layers from a semiconductor wafer has been chemical mechanical polishing (CMP). In CMP, a mildly abrasive slurry is poured onto a polishing pad, and the wafer surface is then pressed onto the slurry with a force calculated to exert a certain pressure on the surface of the wafer. The polishing pad and the surface of the wafer move against each other causing the abrasive slurry to grind away the conductive or barrier layers on the surface of the wafer.

Figure 4A:
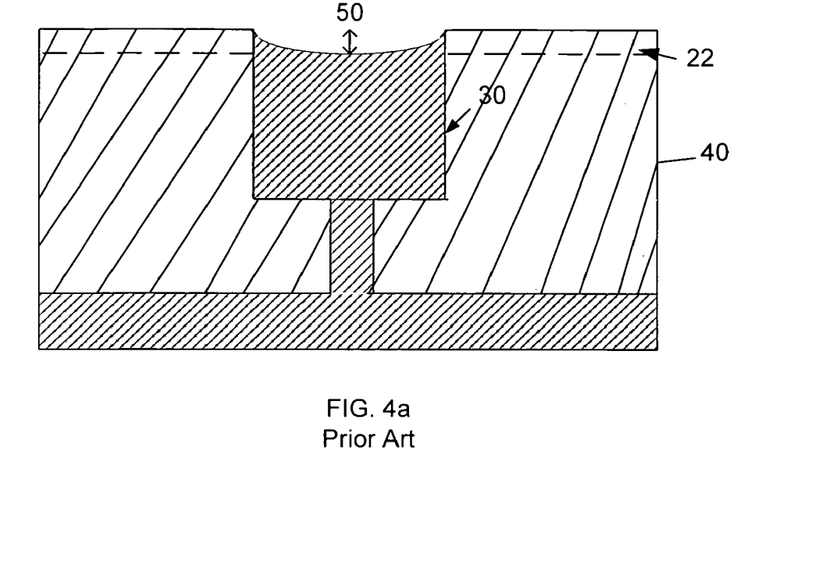
FIGS. 4a–4c represent cross-sections of structures from the Prior Art.

One problem associated with the CMP process is that some areas of the substrate may exhibit a dishing 50 in the conductive layer after a CMP process has been performed (see FIG. 4a). This dishing 50 may be defined as the vertical distance from the top of a dielectric layer 40 to the bottom of a conductive layer 30 after the CMP process has been performed. The extent of the dishing 50 may be severe, in which the vertical distance from the top of the dielectric layer 40 to the bottom of the conductive layer 30 may be significant, or the extent of the dishing may be slight, and may include such things as scratches, abrasions, surface roughness, etc. Dishing refers to any sort of surface topography, such as mechanically induced topographic effects, such as pad bending, as is known in the art, but also to the chemically induced etching component often referred to as recessing, as is known in the art.

Figure 4B:
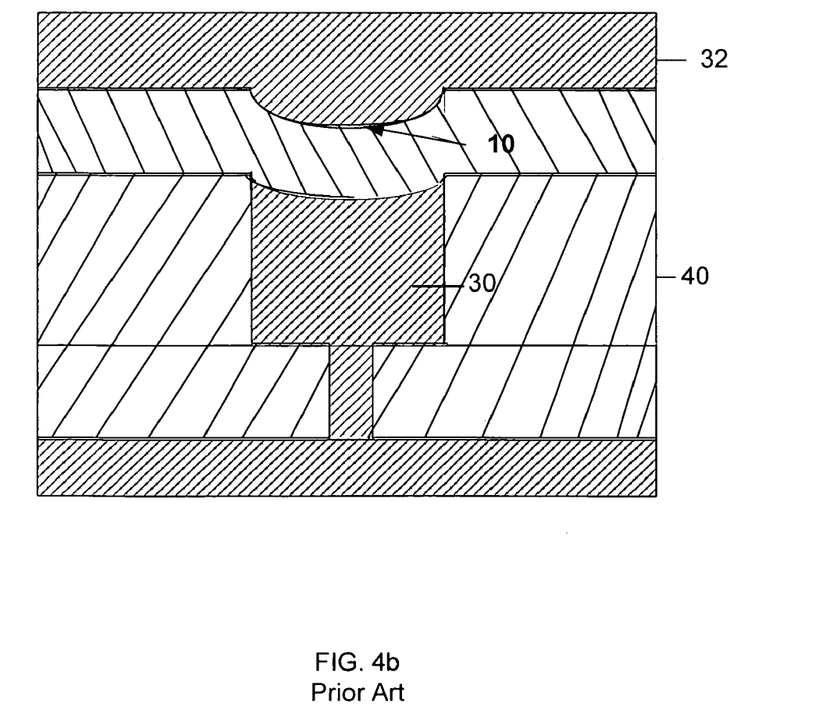
Figure 4C:
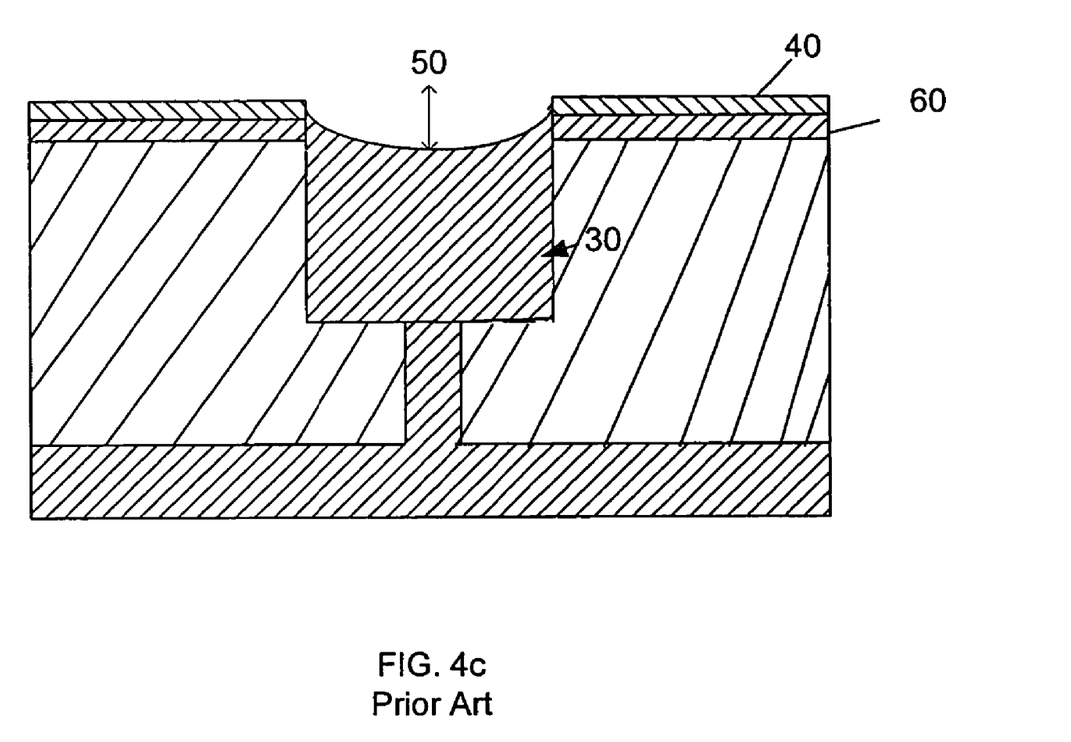

Dishing may lead to significant surface non-planarity in the conductive layer 30 which may cause various integration problems. For example, current processes tend to pass the topography of the dishing 50 from a lower conductive layer 30 to a higher conductive layer 32, which may cause hanging bumps 10 that can cause shorting between the various conductive layers (FIG. 4k). Prior art approaches to reduce or remove the amount of dishing 50 in the conductive layer 30 include removing some portion 22 of the dielectric layer 40 (see FIG. 4a) by using a CMP process which planarizes the conductive layer 30 and the dielectric layer 40, thus substantially removing the dishing 50. However, this approach cannot be performed when a hardmask layer 60 (a layer that stops the etching, or removal of an underlying layer) is used on the dielectric layer 40 without removing or damaging the hardmask layer 60 (see FIG. 4c).

Accordingly, there is a need for improved methods of removing the dishing in a conductive layer when a hardmask is used on a microelectronic device. The present invention provides such methods and their associated structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a sacrificial planarization layer to enhance the planarization of metallic interconnects and its associated structures are described. That method comprises providing a substrate comprising a sacrificial layer that is disposed on a hard mask layer. The substrate further includes a metal layer disposed in a trench of the substrate and on the sacrificial layer. The metal layer is then removed at a first removal rate wherein a dishing may be induced on a top surface of the metal layer. The removal of the metal layer is stopped when an underlying sacrificial layer is exposed. Then, the metal layer and the sacrificial layer are simultaneously removed at a second removal rate until the dishing in the metal layer is substantially removed, without substantially removing the underlying hard mask layer.

Figure 1A:
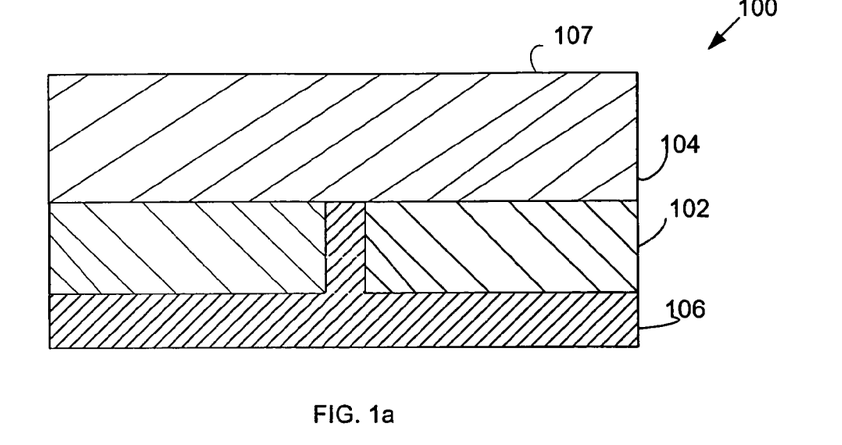
FIGS. 1a–1i represent cross-sections of structures that may be formed when carrying out an embodiment of the method of the present invention.

FIGS. 1a–1i together illustrate an embodiment of a method of forming a microelectronic structure. FIG. 1a illustrates a portion of a substrate 100. The substrate 100 may include isolation regions, such as a first interlayer dielectric (ILD) layer 102, a second ILD layer 104 and conductive regions, such as the interconnect region 106 that have been formed in a bulk silicon or silicon-on-insulator substructure. The first ILD layer 102 and the second ILD layer 104 can comprise any type of dielectric, although a dielectric having a low dielectric constant k (i.e., a low-k dielectric) is preferred to reduce the cross-capacitance that occurs, for example, between neighboring interconnect regions, as is well known in the art.

Figure 1B:
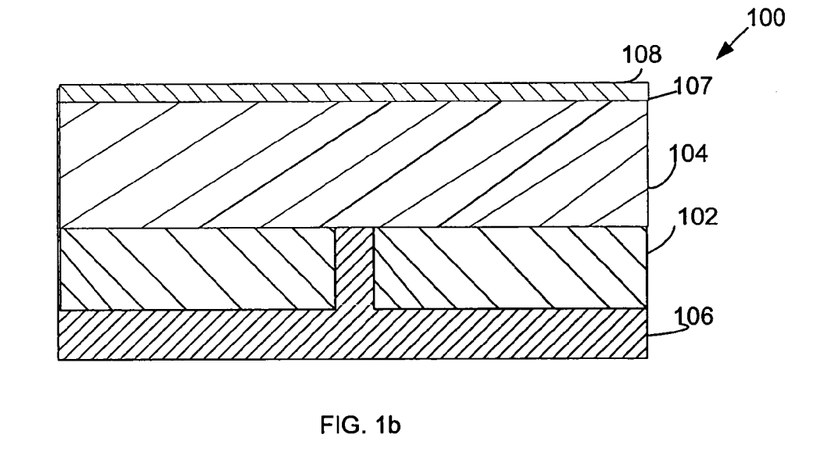

A hard mask layer 108 may be formed on a first surface 107 of the substrate 100 (which in this embodiment is the second ILD layer 104) using conventional deposition techniques, such as chemical vapor deposition (CVD) or plasma vapor deposition (PVD) processes (FIG. 1b). The hard mask layer 108 may protect an underlying layer, such as the second ILD layer 104, during subsequent process steps. The hard mask layer 108 may comprise silicon carbide, silicon nitride, silicon oxynitride or silicon carbon nitride. In most applications, hard mask layer 108 may be between about 50 angstroms and 400 angstroms thick, and more preferably may be between about 150 angstroms and about 250 angstroms thick.

Figure 1C:
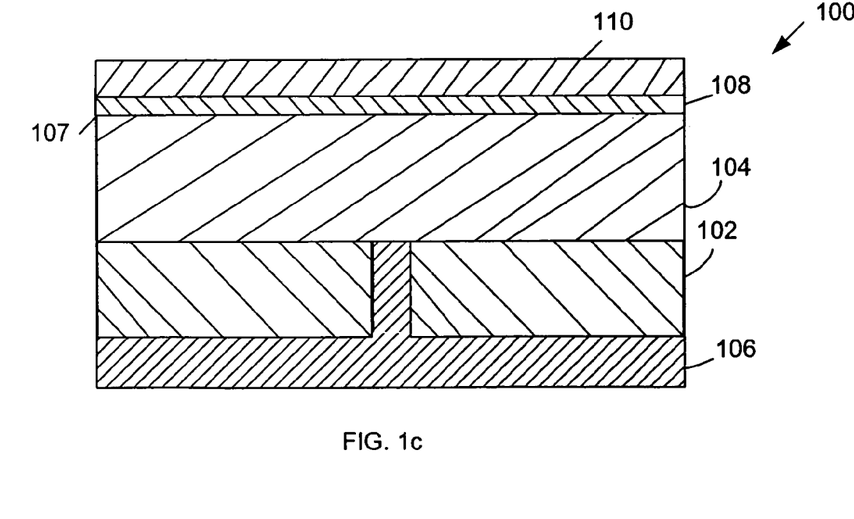

A sacrificial layer 110 may be formed on the hard mask layer 108 using conventional deposition techniques, such as chemical vapor deposition (CVD) or plasma vapor deposition (PVD) processes (FIG. 1c). The sacrificial layer 110 functions to improve the planarization of the surface topology of a subsequently deposited metal layer, as will be described further herein. The sacrificial layer 110 may include but is not limited to non porous spin on glass (SOG), undoped silicate glass (USG), tetraethoxysilane (TEOS), fluorine doped silicon dioxide (SOIF) and carbon doped oxide (CDO), silicon carbide, silicon nitride, silicon oxynitride or silicon carbon nitride. The sacrificial layer 110 should possess a dielectric constant that is moderate to low in value, for example the dielectric constant of the sacrificial layer 110 is preferably below about 5. In most applications, the sacrificial layer 110 may be between about 300 angstroms and 1000 angstroms thick, and more preferably may be between about 400 angstroms and about 800 angstroms thick, however the thickness will primarily depend on the particular application, and more importantly will depend on a subsequent metal removal step to be discussed further herein.

Figure 1D:
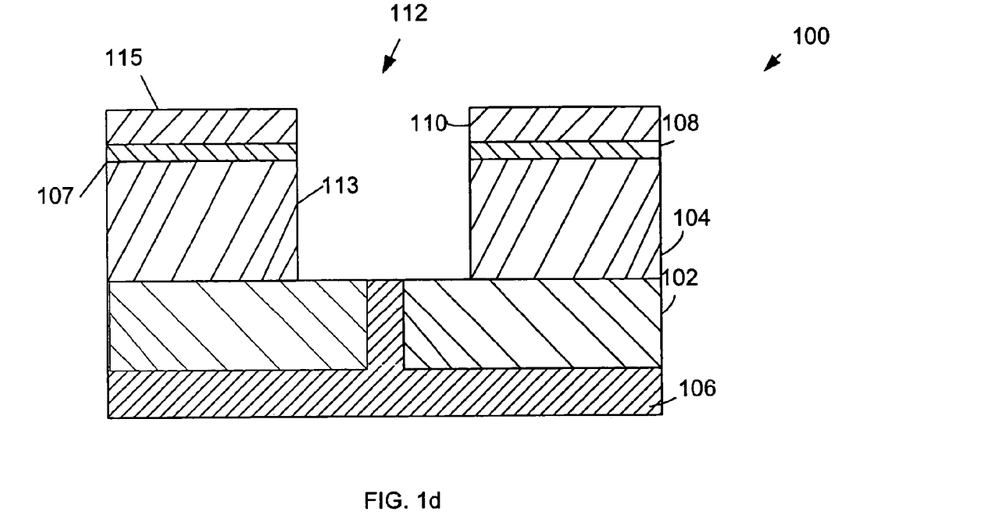

FIG. 1d shows a trench 112 that is formed in the substrate 100, according to the method of the current embodiment, using ordinary masking and etching processes known in the art. It is appreciated that the trench 112 is necessarily formed through the sacrificial layer 110 and the hard mask layer 108, as well as through the substrate 100. In the embodiment shown, the trench 112 may be a trench that can be used to form an electrical interconnect between other components (not shown) on a microelectronic structure, but in other embodiments the feature may be something different.

Figure 1E:
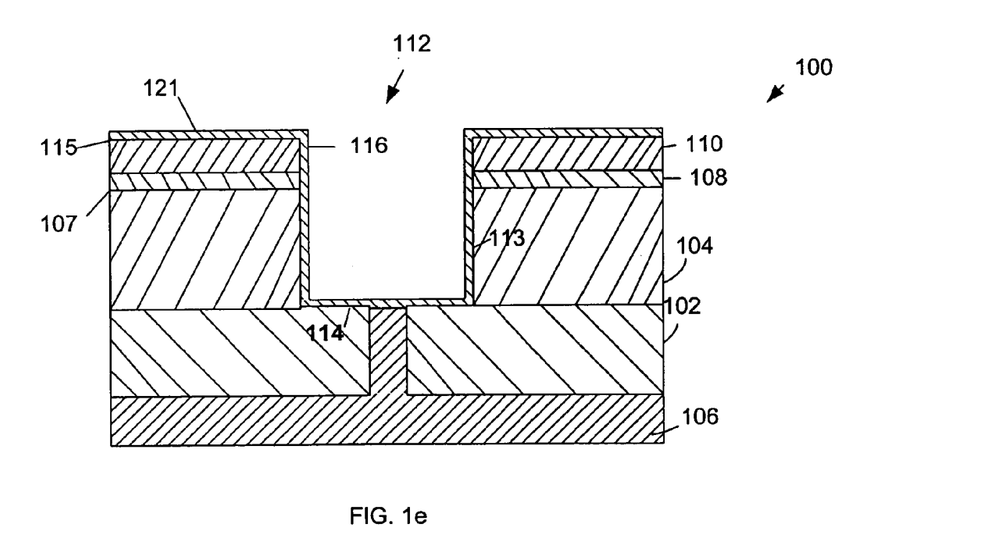

A barrier layer 116 may then be deposited on the sidewalls 113 and bottom 114 of the trench 112, and may also be deposited on a top surface 115 of the sacrificial layer 110 (FIG. 1e). The barrier layer 116 may be deposited in the trench 112 and on the top surface 115 of the sacrificial layer 110 using one of several techniques that are well known to those skilled in the art, including CVD, PVD, atomic layer deposition (ALD), etc. The barrier layer 116 may be conductive to provide a seed layer for a subsequent electroplating process, and may further provide protection to the second ILD layer 104 from diffusion and electromigration caused by high electrical current densities and/or electrical fields. Copper in particular can contaminate ILDs because it is a rapid diffuser in silicon. The barrier layer 116 may include but is not limited to tantalum (Ta) or tantalum nitride (TaN). In most applications, the barrier layer 116 should be between about 50 angstroms and 300 angstroms thick, and more preferably between about 100 angstroms and about 250 angstroms thick.

Figure 1F:
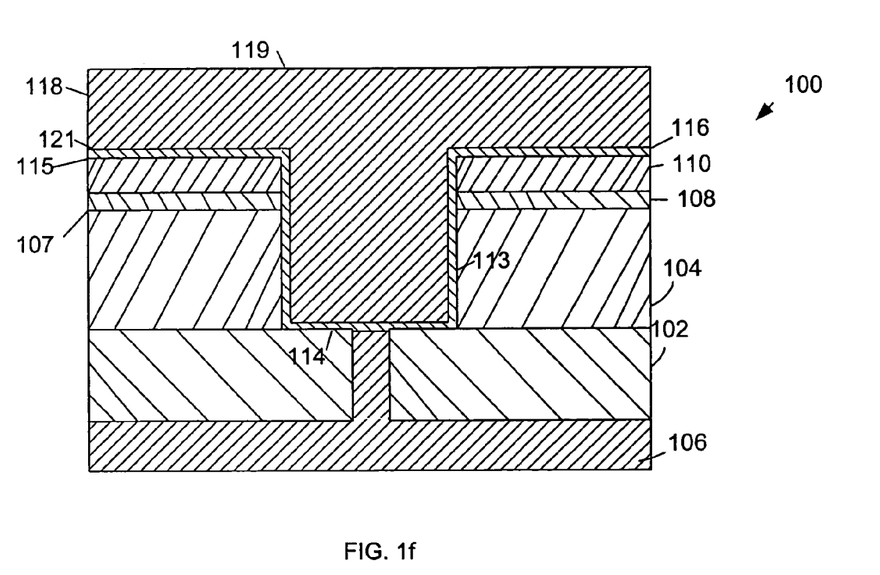

A metal layer 118 may then be electroplated on the barrier layer 116 (FIG. 1f). The electroplating process is well known to those skilled in the art and will not be described further herein. The metal layer 118 may include but is not limited to copper. In most applications, the metal layer 118 may be plated at a level above a top surface 121 of the barrier layer 116. The metal layer 118 comprises a top surface 119 of the metal layer 118 that is disposed over the barrier layer 116 and the trench 112.

Figure 1G:
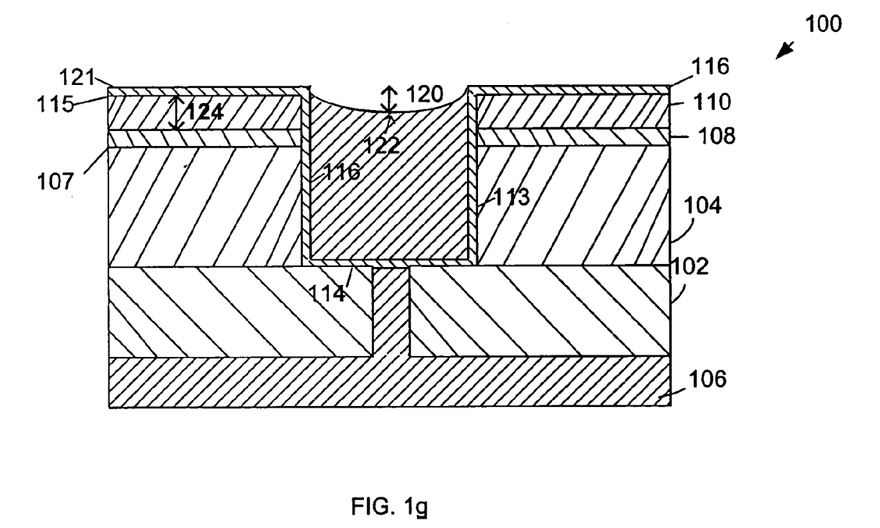

The metal layer 118 may be removed utilizing a chemical mechanical polishing process (CMP), for example, as is well known in the art, or by other well known removal, or polishing processes. Although the process parameters of the CMP process may depend on the particular application, in general they may comprise a metal polishing slurry comprising an abrasive such as fumed silica or alumina, a pH from about 2 to about 9, an oxidizer such as peroxide, a spin speed of about 30 to about 100, a slurry flow rate from about 100 to about 300 ml/minute, and a pressure of about 1 to about 2 psi. The metal layer 118 may be simultaneously removed from both the top surface 121 of the barrier layer 116 disposed over the sacrificial layer 110 and from the portion of the metal layer 118 disposed over the trench 112 (FIG. 1g).

The selectivity (i.e. the removal rate of the metal layer 118 as compared to the removal rate of the barrier layer 116) of the metal layer 118 removal process is chosen so that the removal rate (or polish rate) of the metal layer 118 is much greater than the removal rate of the barrier layer 116. The metal layer 118 removal rate may preferably be greater than about 50 times the removal rate of the barrier layer 116. It will be appreciated by those skilled in the art that the specific process parameters for the metal layer 118 removal process may vary depending on the particular application.

The metal layer 118 disposed over the region of the barrier layer 116 disposed over the sacrificial layer 110 may be substantially removed until a top surface 121 of the barrier layer 116 that is disposed over the sacrificial layer 110 is exposed, and then the removal process may be stopped. Removing the metal layer 118 until the top surface of the barrier layer 121 is exposed induces a dishing 120 in the top surface 119 of the metal layer 118 disposed over and/or within the trench 112. The dishing 120 may be defined here as the vertical distance from a top surface of the polishing plane (i.e. the top surface of the barrier layer 121 in this example) to a lowest depth of the metal layer 122 after the CMP process has been performed on the metal layer 118. The dishing 120 may lead to significant surface non-planarity in the metal layer 118 which may cause various device integration problems, such as shorting between subsequently formed metal lines disposed above metal layer 118. It will be appreciated by those with skill in the art that the metal layer 118 disposed over and/or within the trench 112 remains intact after the metal layer 118 disposed over the top surface of the barrier layer 121 is substantially removed.

Figure 1H:
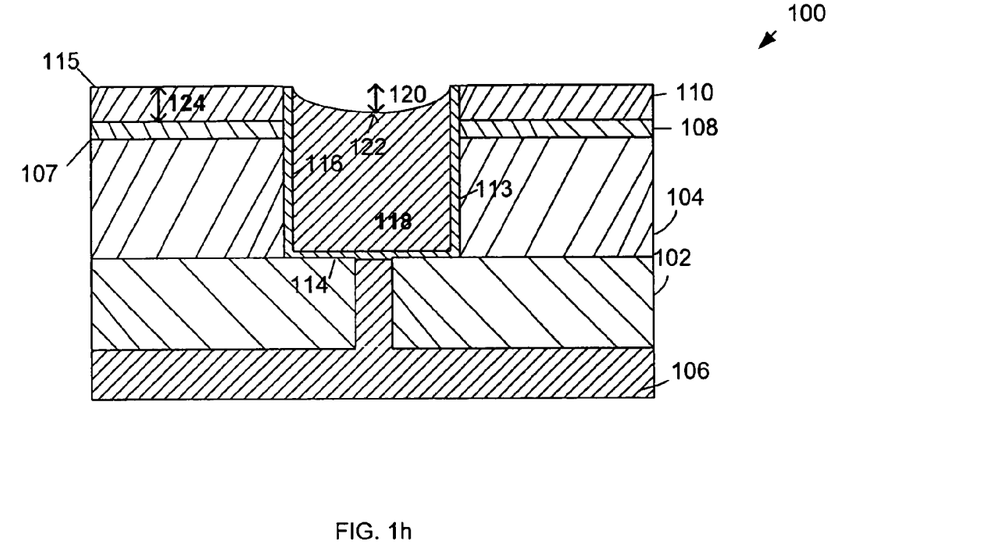

The barrier layer 116 may then be removed using a CMP process, for example, until the underlying sacrificial layer 110 is exposed (FIG. 1h). The barrier layer 116 removal process may be selected so that the removal rate of the barrier layer 116 may be much greater than the removal rate of the sacrificial layer 110. The removal rate of the barrier layer may preferably be about 50 times greater than the removal rate of the sacrificial layer 110. The removal rate of the metal layer 118 disposed over and/or within the trench 112 may be about equal to the removal rate of the barrier layer 116, or may be less than the removal rate of the barrier layer 116. It will be appreciated by those skilled in the art that the metal layer 118 disposed over the trench 112 may be further removed during the removal of the barrier layer 116, which may or may not increase the dishing 120 in the metal layer 118 disposed over and/or within the trench 112. The barrier layer 116 may be substantially removed until the top surface 115 of the sacrificial layer 110 is exposed, and then the removal process may be stopped.

Although the process parameters of the CMP barrier layer 116 removal process may depend on the particular application, in general they may comprise a barrier polishing slurry comprising an abrasive such as silica, a pH from between about 8 to about 11, an oxidizer such as peroxide, a spin speed of between about 30 and about 60 rpm, a slurry flow rate of at least about 100 to 300 ml/min and a pressure of about 1 to 2 psi.

Figure 1I:
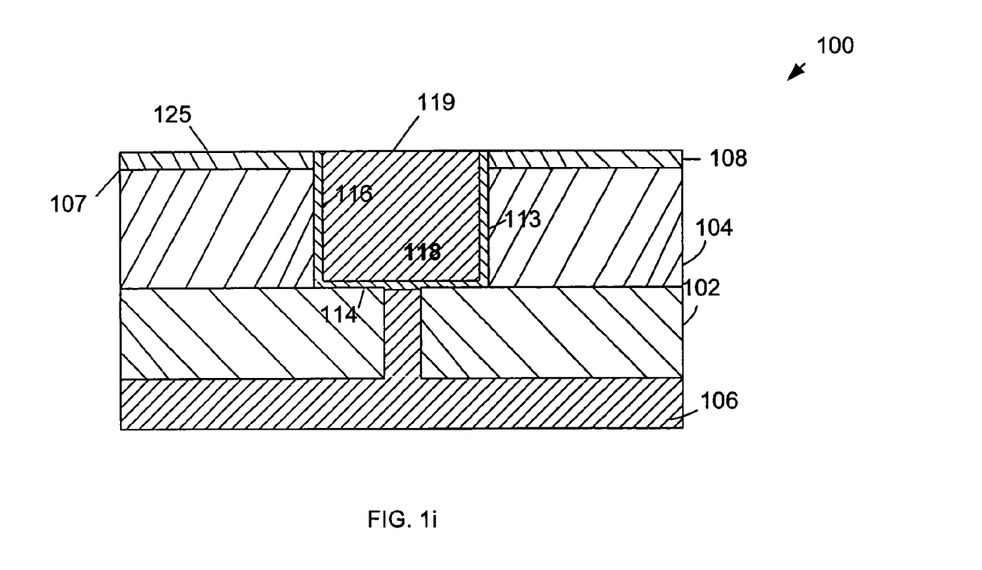

The sacrificial layer 110 may then be removed using a CMP process, for example, until the underlying hard mask layer 108 is exposed (FIG. 1i). The sacrificial layer 110 may be removed until a top surface 125 of the hard mask layer 108 is exposed, and then the removal process may be stopped. The sacrificial layer 110 removal process is selected so that the removal rate of the sacrificial layer 110 may preferably be much greater than the removal rate of the hard mask layer 108. The removal rate of the sacrificial layer 110 may be greater than about 10 times the removal rate of the hard mask layer 108, and may preferably be about 100 times greater than the removal rate of the hard mask layer 108. The removal rate of the metal layer 118 may be substantially the same or less than the removal rate of the sacrificial layer 110, and may be at least 10 times and may preferably be about 100 times faster than the removal rate of the hard mask layer 108. The sacrificial layer 110 and the metal layer 118 disposed within and/or above the trench 112 may be removed simultaneously at substantially the same removal rate.

Although the process parameters of the CMP sacrificial layer 110 removal process may depend on the particular application, in general they may comprise an sacrificial layer 110 polishing slurry comprising an abrasive such as silica, a pH from between 8 to 11, an oxidizer such as peroxide, a spin speed of between 30 and 60 rpm, a slurry flow rate from about 100 to 300 ml/min and a pressure of about 1 to about 2 psi Referring back to FIG. 1h, the thickness of the sacrificial layer 124 is designed to be greater than the process window, or tolerance of the depth of the dishing 120 for a particular metal layer 118, so that when the sacrificial layer 110 is substantially removed, the dishing 120 will be substantially removed from the metal layer 118 disposed within and/or above the trench 112. Thus the thickness of the sacrificial layer 124 will be tailored depending on the particular process parameters for each application. Because the removal rates of the metal layer 118 and the sacrificial layer 110 are preferably about 50 to about 100 times greater than the removal rate of the hard mask layer 108, the hard mask layer 108 remains intact after the sacrificial layer 110 and the dishing 120 in the metal layer 118 are substantially removed. The method of the current embodiment greatly enhances the planarity of the metal layer 118, since it substantially removes the dishing 120 from the top surface of the metal layer 119 that was induced by the metal layer 118 removal process. The metal layer 118 is thus planarized to remove the dishing 120 without removing the underlying hard mask layer 108, thereby protecting the ILD layer beneath the hard mask layer 108 from subsequent processing.

Figure 2A:
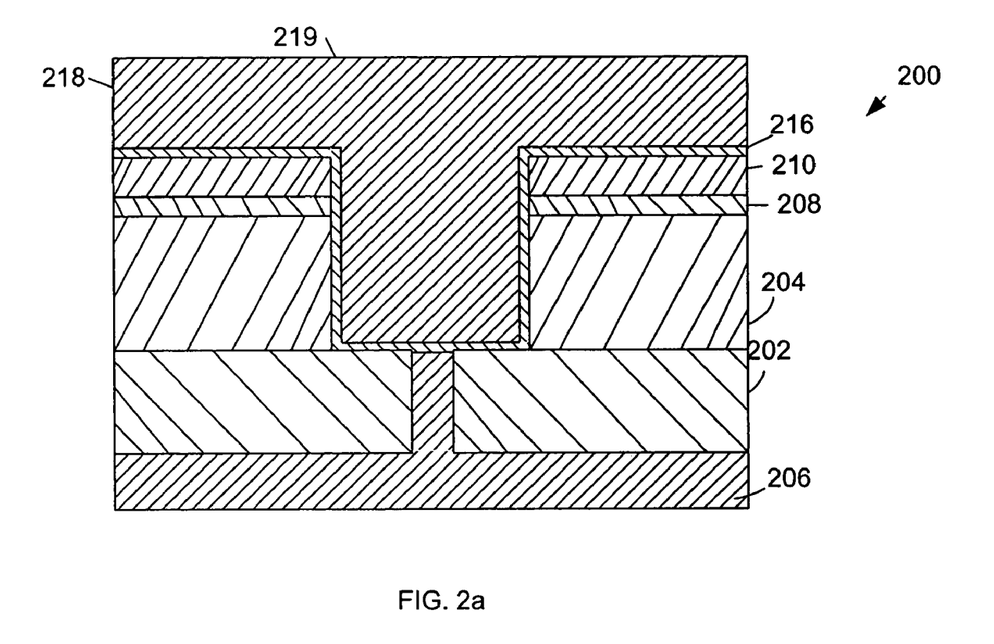
FIGS. 2a–2c represent cross-sections of structures that may be formed when carrying out another embodiment of the method of the present invention.
Figure 2B:
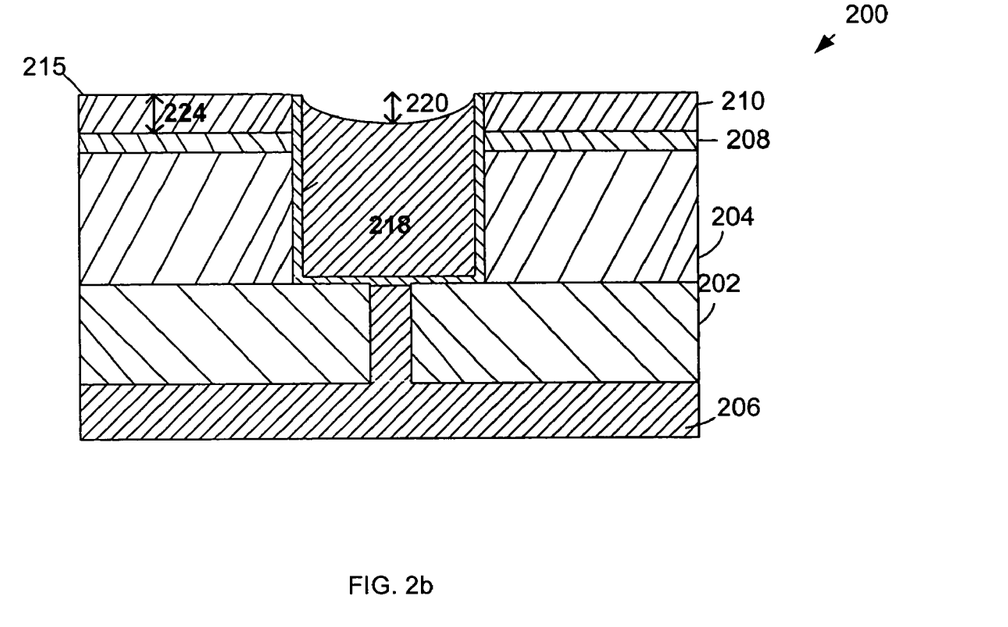

In another embodiment of the present invention, a metal layer 218 may be disposed on a region of a barrier layer 216 that is disposed on a sacrificial layer 210 (FIG. 2a). The sacrificial layer 210 may be disposed on a hard mask layer 208 that is disposed on a second ILD layer 204 that is in turn disposed on a first ILD layer 202. The first ILD layer 202 may be disposed on a conductive region 206. The metal layer 218 may be substantially removed at a first removal rate until a top surface 223 of the sacrificial layer 210 is exposed, and then the removal process may be stopped (FIG. 2b). The barrier layer 216 may also be removed at the first removal rate during the removal of the metal layer 218. It will be appreciated by those with skill in the art that the barrier layer 216 may or may not be present, since the removal of the metal layer 218 is stopped on the surface of the sacrificial layer 212. Removing the metal layer 218 until the top surface 223 of the sacrificial layer 210 is exposed induces a dishing 220, similar to the dishing 120, in a top surface 219 of the metal layer 218. It will be appreciated by those with skill in the art that the metal layer 218 remains intact after the metal layer 218 disposed over the top surface 215 of the sacrificial layer 212 is substantially removed.

Figure 2C:
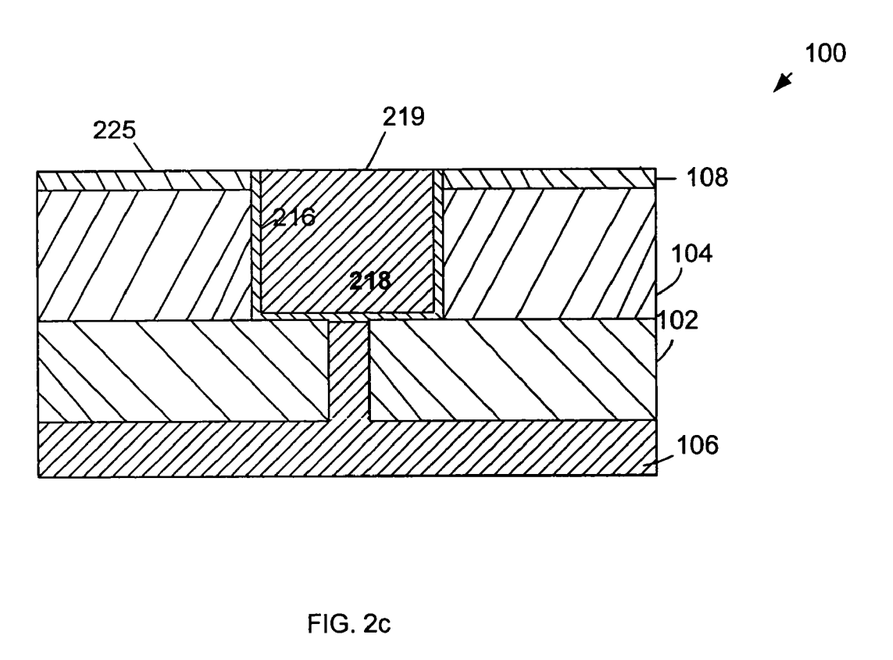

The sacrificial layer 210 may then be removed using a CMP process, for example, until the underlying hard mask layer 208 is exposed (FIG. 2c). The sacrificial layer 210 may be removed at a second removal rate until a top surface 225 of the hard mask layer 208 is exposed, and then the removal process may be stopped. The sacrificial layer 210 removal process is selected so that the removal rate of the sacrificial layer 210 may be much greater than the removal rate of the hard mask layer 208. The removal rate of the sacrificial layer may be about 10 times greater than the removal rate of the hard mask layer 208, and may preferably be about 100 times greater than the removal rate of the hard mask layer 208. The removal rate of the metal layer 218 may be substantially the same or less than the removal rate of the sacrificial layer 210, and may be at least about 10 times and may be preferably about 100 times faster than the removal rate of the hard mask layer 208. The sacrificial layer 210 and the metal layer 218 disposed over the trench 212 may therefore be removed simultaneously at substantially the same removal rate.

Referring back to FIG. 2b, the thickness 224 of the sacrificial layer 210 is designed to be greater than the process window, or tolerance of the depth of the dishing 220 for a particular metal layer 218, so that when the sacrificial layer 210 is substantially removed, the dishing 220 will be substantially removed from the metal layer 218 disposed within and/or above the trench 212. The hard mask layer 208 remains intact after the sacrificial layer 210 and the dishing 220 in the metal layer 218 are substantially removed, thus protecting the underlying ILD layer from subsequent processes.

Figure 3A:
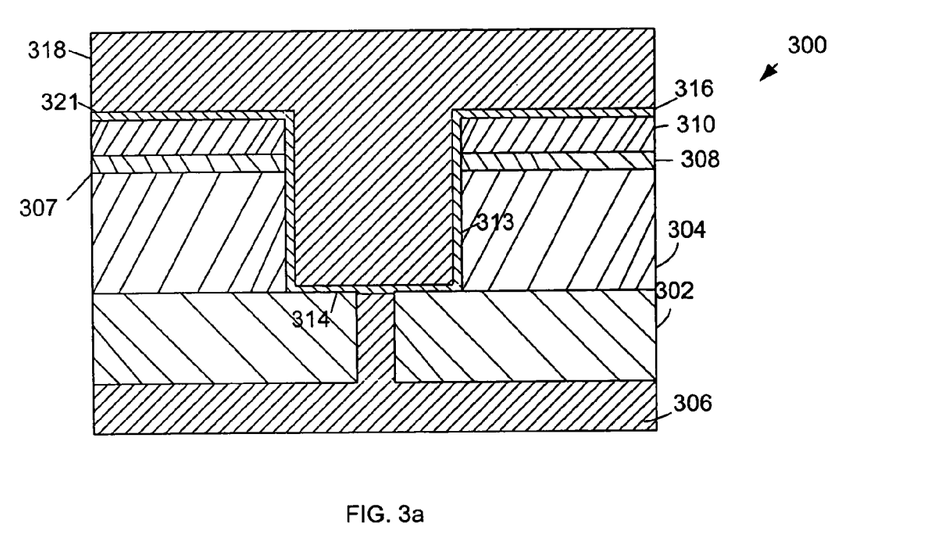
FIGS. 3a–3c represent cross-sections of structures that may be formed when carrying out another embodiment of the method of the present invention.
Figure 3B:
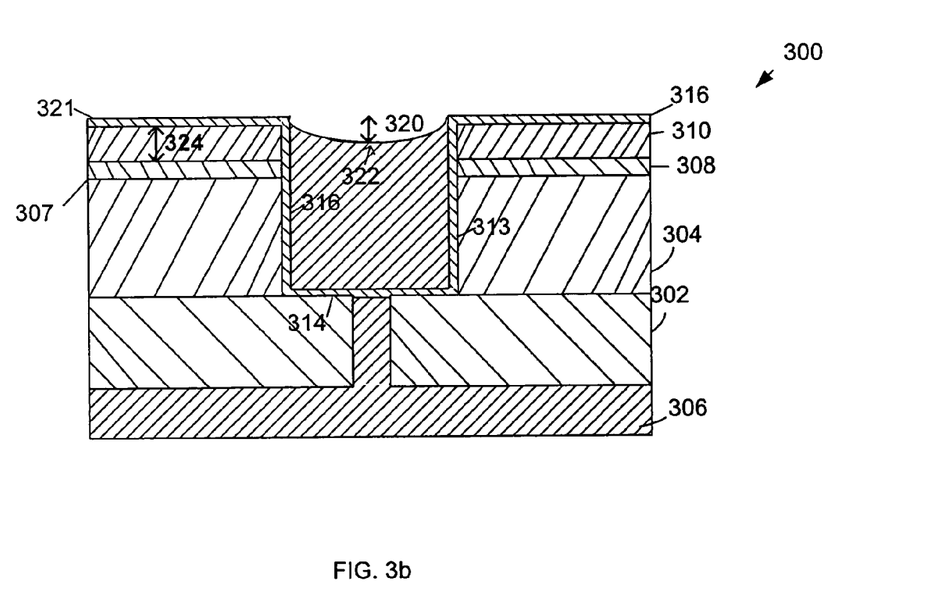

In another embodiment, a metal layer 318 may be disposed on a region of a barrier layer 316 that is disposed on a sacrificial layer 310 (FIG. 3a). The sacrificial layer 310 may be disposed on a hard mask layer 308 that is disposed on a first surface 307 of a second ILD layer 304 that is in turn disposed on a first ILD layer 302. The first ILD layer 302 may be disposed on a conductive region 306. The metal layer 318 may be substantially removed at a first removal rate until a top surface 321 of the barrier layer 316 is exposed, and then the removal process may be stopped (FIG. 3b).

Figure 3C:
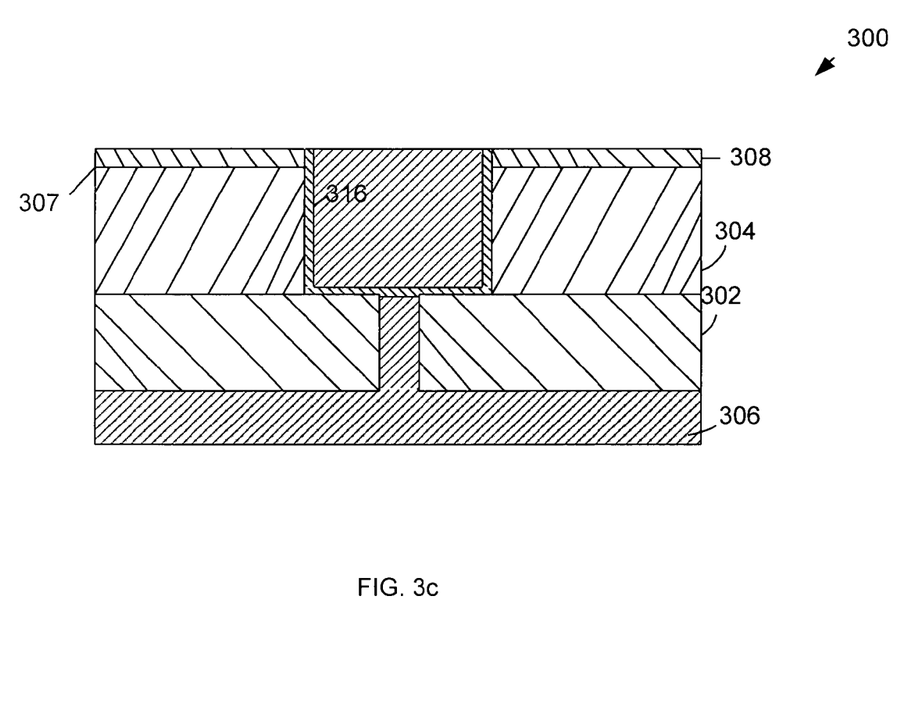

The barrier layer 316 and the sacrificial layer 310 (as well as the metal layer 318 may then be simultaneously removed using a CMP process, for example, until the underlying hard mask layer 308 is exposed (FIG. 3c). The removal rates of the barrier layer 316, the sacrificial layer 310, and the metal layer 318 may preferably be about equal to each other, but each of the removal rates of the aforementioned layers may be at least about 10, and may preferably be about 100 times greater than the removal rate of the hard mask layer 308.

Referring back to FIG. 3b, the thickness 324 of the sacrificial layer 310 is designed to be greater than the process window, or tolerance of the depth of the dishing 320, so that when the sacrificial layer 310 is substantially removed, the dishing 320 will be substantially removed from the metal layer 318. The hard mask layer 308 remains intact, thus protecting the underlying ILD layer from subsequent processes.

As described above, the present invention provides methods and associated structures of forming a sacrificial planarization layer that reduces the dishing that may be present in the CMP removal of a metal layer disposed in a trench. The use of a sacrificial layer to reduce the dishing greatly enhances the reliability of a microelectronic device fabricated according to the methods of the present invention, since shorting between metal lines will be greatly reduced. This enhances the reliability and performance of a device fabricated according to the various embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a microelectronic device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. An intermediate product comprising:
   a metal layer disposed in a trench of a substrate, wherein the metal layer comprises a dishing in a top surface of the metal layer;
   a hard mask layer disposed on a first surface of the substrate;
   a sacrificial layer disposed on the hard mask layer; wherein a ratio of a thickness of the sacrificial layer to a depth of the dishing in the top surface of the metal layer is equal to or greater than about 1:1.

2. The intermediate product of claim 1 wherein the metal layer comprises copper.

3. The intermediate product of claim 1 wherein the thickness of the sacrificial layer is from about 300 angstroms to about 1,000 angstroms and comprises a dielectric material.

4. The intermediate product of claim 1 wherein the thickness of the hard mask layer is from about 50 angstroms to about 250 angstroms.

* * * * *

UNITED STATES PATENT AND TRADEMARK OFFICE
CERTIFICATE OF CORRECTION

PATENT NO. : 7,109,557 B2  
APPLICATION NO. : 10/963839  
DATED : September 19, 2006  
INVENTOR(S) : Barns et al.

It is certified that error appears in the above-identified patent and that said Letters Patent is hereby corrected as shown below:

In column 2, at line 1, delete "4k" and insert --4b--.  
In column 7, at line 13, after "318" insert --)--.

Signed and Sealed this

Twenty-seventh Day of November, 2007

JON W. DUDAS  
*Director of the United States Patent and Trademark Office*